United States Patent [19]

Ito et al.

[11] Patent Number: 5,167,985
[45] Date of Patent: Dec. 1, 1992

[54] PROCESS FOR PRODUCING FLEXIBLE PRINTED CIRCUIT BOARD

[75] Inventors: Hiroshi Ito, Ohtsu; Hirosaku Nagano, both of Ohtsu, Japan; Hiroyuki Furutani, Cuyahoga Falls, Ohio; Hitoshi Nojiri, Ohtsu, all of Japan

[73] Assignee: Kanegafuchi Kagaku Kogyo K.K., Osaka, Japan

[21] Appl. No.: 614,483

[22] Filed: Nov. 16, 1990

[30] Foreign Application Priority Data

Nov. 17, 1989 [JP] Japan .................. 1-300639

[51] Int. Cl.⁵ ............................. B05D 7/14
[52] U.S. Cl. .................. 427/96; 427/388.1; 427/388.5
[58] Field of Search ............ 427/96, 350, 377, 388.1, 427/98, 388.5

[56] References Cited

U.S. PATENT DOCUMENTS

| | | | |
|---|---|---|---|
| 4,189,518 | 2/1980 | Peterson | 427/388.1 |
| 4,512,893 | 4/1985 | Makino et al. | 210/500.28 |
| 4,670,325 | 6/1987 | Bakos et al. | 427/96 |
| 4,788,098 | 11/1988 | Sado et al. | 156/308.2 |
| 4,830,640 | 5/1989 | Nakamura et al. | 55/68 |
| 4,839,217 | 6/1989 | Tabata et al. | 428/458 |
| 4,898,753 | 2/1990 | Inoue et al. | 427/379 |
| 4,916,009 | 4/1990 | Hino et al. | 428/458 |
| 4,948,400 | 8/1990 | Yamada et al. | 55/158 |

FOREIGN PATENT DOCUMENTS

| | | |
|---|---|---|
| 54-66966 | 5/1979 | Japan . |
| 54-108272 | 8/1979 | Japan . |
| 58-190091 | 9/1983 | Japan . |
| 58-190092 | 11/1983 | Japan . |
| 58-190093 | 11/1983 | Japan . |
| 59-82783 | 5/1984 | Japan . |
| 60-206639 | 10/1985 | Japan . |

*Primary Examiner*—Shrive Beck
*Assistant Examiner*—Diana L. Dudash
*Attorney, Agent, or Firm*—Sughrue Mion Zinn Macpeak & Seas

[57] ABSTRACT

A process for producing a flexible printed circuit board comprising a metallic foil and a polyimide is provided, which comprises coating a metallic foil with a resin solution prepared by adding a tertiary amino compound to a solution of a polyamic acid (a polyimide precursor) represented by the following general formula (I):

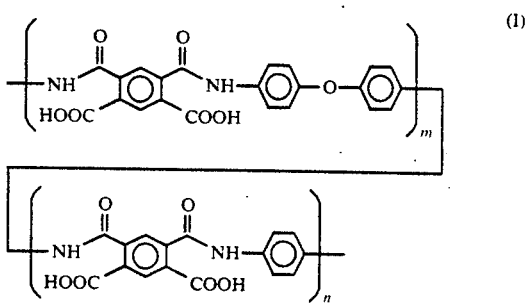

followed by the imidization thereof, the amount of said tertiary amino compound added to the solution being 10 to 50 parts by weight per 100 parts by weight of solid polyamic acid contained in said resin solution. According to the present invention, a flexible printed circuit board which is free from curling, wrinkling and warping, and which has excellent heat resistance, electrical characteristics and mechanical properties is provided with a simplified production process.

2 Claims, No Drawings

PROCESS FOR PRODUCING FLEXIBLE PRINTED CIRCUIT BOARD

BACKGROUND OF THE INVENTION

1. Field of the Invention

The present invention relates to a process for producing a flexible printed circuit board comprising a thin layer of a polyimide and a metallic foil, which is excellent in heat resistance, electrical characteristics and mechanical properties, and which can be free from curling, wrinkling, warping, and the like.

2. Description of the Prior Art

Prior flexible printed circuit boards have generally been produced by bonding a metallic foil such as a copper foil, etc., and an insulating film of, e.g., organic polymers, using an adhesive. However, if heat history such as thermal adhesion or the like is applied to such boards upon their production, there will result curling, twisting, warping, etc., at the time of their cooling, thus making it impossible to carry out subsequent steps such as patterning. There have also been investigated methods for producing flexible printed circuit boards without using any adhesives. It is however difficult to obtain by such methods flexible printed circuit boards which generate no curling and wrinkling resulting from temperature change.

With regard to methods for solving the problem of curling, there is disclosed, in Japanese Patent Publication (Laid Open) No. 66,966/79, a method in which a composite film consisting of polyimide and a metallic foil is subjected to heat treatment at an elevated temperature for a long period of time, and in Japanese Patent Publication (Laid Open) No. 108,272/79 there is disclosed a method wherein a composite film is wound into a cylindrical form with its resin layer outward and then subjected to heat treatment at 100° to 200° C. for a long period of time so as to eliminate curling. Although curling can be rectified to a considerable degree according to the above methods, putting such methods into practice can be problematic since various apparatuses are required for the aftertreatment and the addition of aftertreatment prolongs the total period of time.

There are also proposed methods in which a polyamic acid (a polyimide precursor) or a solution of a polyimide, having a linear expansion coefficient of about the same level as that of a metallic foil is directly cast on the metallic foil, followed by the removal of solvents and the curing thereof [Japanese Patent Publication (Laid Open) Nos. 206,639/85; 190,091-3/83 and 82,783/84]. However, when these methods are practiced in the air, the problem arises that the characteristics of the polyimide layer of the thus obtained printed circuit boards come to be considerably inferior to those of a polyimide film prepared separately.

SUMMARY OF THE INVENTION

An object of the present invention is to provide a process for producing flexible printed circuit board which is free from curling, wrinkling, warping, etc., even when heat history is applied to it, and which is excellent in heat resistance, electrical characteristics and mechanical properties.

Other objects and advantages will be apparent to those skilled in the art through reading the following detailed description.

The present inventors have carried out intensive investigations in order to attain the above objects and, as a result, have found out that the above objects can be achieved by making the linear expansion coefficient of the polyimide thin layer close to that of the metallic foil.

DETAILED DESCRIPTION OF THE INVENTION

The present invention is concerned with a process for producing a flexible printed circuit board comprising a metallic foil and a polyimide, which comprises coating said metallic foil with a resin solution prepared by adding a tertiary amino compound to a solution of a polyamic acid (a polyimide precursor) represented by the following general formula (I):

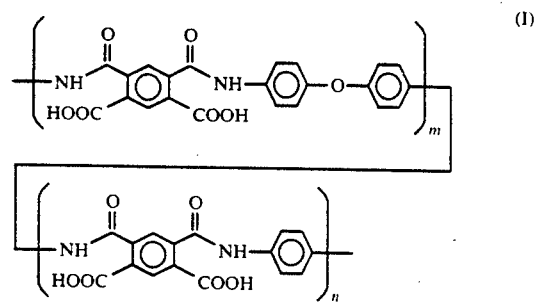

followed by the imidization thereof, the amount of said tertiary amino compound added to the solution being 10 to 50 parts by weight per 100 parts by weight of solid polyamic acid contained in said resin solution.

As examples of metal foils usable in the present invention, there are included foils of copper, aluminum, iron, gold, silver, nickel, chromium, molybdenum, or the like. It is preferable, with regard to price and adhesiveness, to use a copper foil, in particular, a foil of electrolytic copper.

The metallic foil may be subjected to mechanical surface treatment by means of sanding, nickel plating, etc., or to chemical surface treatment with aluminum alcoholates, aluminum chelates, silane coupling agents, etc.

Polyimides directly bonded to the metallic foil and represented by the following general formula (II):

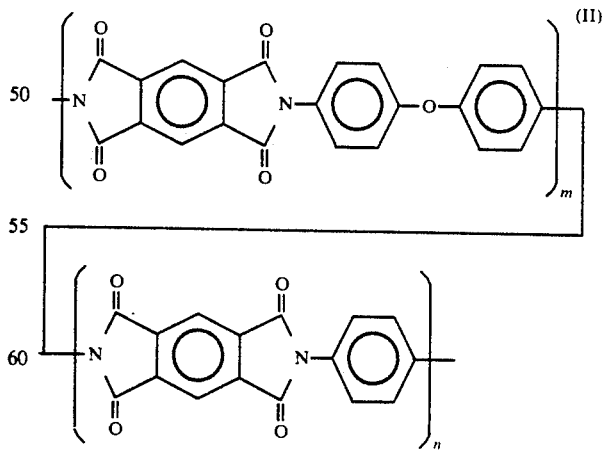

can be obtained by curing a polyamic acid represented by the general formula (I) as mentioned earlier.

Polyamic acids represented by the general formula (I) can be obtained by reacting p-phenylenediamine and 4,4'-diaminodiphenyl ether with pyromellitic dianhydride.

The polymerization of the above two kinds of diamines can be carried out according to various patterns, using two diamines in various ratios. With regard to their ratio, when the ratio of p-phenylenediamine is too high, the flexibility of the cured polyimide film is lost, and thus it is not suitable for flexible printed circuit boards. When the ratio of 4,4'-diaminodiphenyl ether is too high, there results a circuit board which is liable to curling, wrinkling, etc., resulting from heat history since the linear expansion coefficient of the cured polyimide becomes higher than that of the metallic foil. The most preferable polymerization ratio varies depending on the kind of metallic foil, but, the ratio of p-phenylenediamine to 4, 4'-diaminodiphenyl ether is preferably in the range of about 10:1 to 1:10. In particular, a ratio in the range of about 3:1 to 1:5 is more preferable. In the case of copper foils, which are most commonly used in printed circuit boards, a polymerization ratio of p-phenylenediamine to 4,4'-diaminodiphenyl ether is most preferable in the range of 1:5 to 1:1.

With regard to methods for the polymerization, any polymerization methods can be employed, including random copolymerization, block copolymerization, and the like. However, polymerization according to the following method is most preferable. Namely, pyromellitic dianhydride is added in an excess molar ratio to a first amine component to give oligomers containing acid anhydride terminals. To this is added a second amine component up to an amount where the total molar quantity of the first amine component and the second amine component is about the same as that of the pyromellitic dianhydride, so as to obtain an alternative copolymer. The thus obtained alternative copolymer, when shaped into a film, exhibits excellent mechanical properties in comparison with random copolymers and ordinary block copolymers.

As examples of organic solvents to be used upon the polymerization reaction and coating, there are included N,N-dimethylformamide, N,N-dimethylacetamide, N,N-diethylformamide, N,N-diethylacetamide, N,N-dimethylacetamide, N-methyl-2-pyrrolidone, dimethylsulfoxide, tetrahydrofuran, and the like. These solvents can be used either singly or in combination of two or more.

In the present invention, a tertiary amino compound is used as an indispensable component. It is preferable to use a heterocyclic tertiary amine. As concrete examples, there are included pyridine, picoline, isoquinoline, quinoline, and the like. The amines can be used either singly or in combination of two or more. Tertiary amines are added up to an amount where their content preferably amounts to 5 to 100% by weight, more preferably 10 to 50% by weight per polyimide.

As an example of method for adding a tertiary amine, there is included one wherein a tertiary amine is admixed into a solution of a polyamic acid in an organic solvent. It is also possible to admix a tertiary amine with a solution of an organodiamine or an organotetracarboxylic acid dianhydride in an organic polar solvent and then a polyamic acid is caused to be produced.

With the addition of a tertiary amine, it is presumed to provide the following effects. That is, the rate of imidization can be made greater and, as a result, the orientation degree along the surface of the film can be improved. Because of this, the linear expansion coefficient along the surface of the film can be effectively lowered, and as a result, the curling of the flexible printed circuit boards can be reduced. Moreover, the addition of tertiary amine not only suppresses the reduction of molecular weight at the time of the formation of polyimides, but improves folding resistance or the like.

If both acetic anhydride and a tertiary amine are added as conventionally practiced upon the production of polyimide films, there will result undesirable bleeding of acetic acid and unreacted acetic anhydride in the course of the imidization, thereby causing oxidization of the metallic foil, peeling off of the film from the metallic foil, or the like.

As examples of methods for coating a metallic foil with a solution of polyamic acids, there are included such known means as a roll coater, knife coater, doctor blade coater and flow coater, whereby the solution is cast or coated at a uniform thickness of 30 to 1,000 $\mu$m. Subsequently, the coated layer is heated to remove the solvents of the polyamic acids and, at the same time, to effect the imidization thereof. With regard to heating conditions, it is preferable to effect the heating by raising the temperature gradually from a low to a high temperature. A maximum temperature is preferably in the range of 200° to 550° C. The heating is preferably carried out at a reduced pressure or in an inactive atmosphere such as nitrogen and the like. In order to prevent curling owing to residual stress of the polyimide layer, there may be effected an anneal treatment or slow cooling.

The present invention will further be illustrated by way of examples. The invention however is by no means limited to these examples.

In the examples, the linear expansion coefficient was determined as set forth below, using a sample of which imidization has been completed, and a thermomechanical analyzer. A polyamic acid was coated and imidized on a copper foil. Thereafter, the copper foil was dissolved and removed to give a film of 25 $\mu$m. The temperature of the film was then raised at a rate of 10° C./min, and the average linear expansion rate of 100° to 200° C. was calculated.

The degree of curling was determined as follows. After the imidization of the polyamic acid coated on the copper foil, the resulting board was cut into a size of 10 cm $\times$ 10 cm, and the radius of curvature of each of the cut boards was measured. Other properties of the printed circuit boards were determined according to the following methods;

Peeling strength:
Determined according to the method of IPC-FC-241A.
Folding resistance:
Determined according to JIS P 8115 at a radius of the folded surface of 0.8 mm and a static load of 500 g.
Dimensional stability:
Determined according to the method of IPC-FC-241A and shown by shrinkage percentage.

EXAMPLE 1

Into 815 g of N,N-dimethylformamide was dissolved 70.28 g of ODA (4,4'-diaminodiphenyl ether). To this was added 102.07 g of PMDA (pyromellitic dianhydride). After the stirring of 1 hour, ca. 12.65 g of p-PDA (p-phenylenediamine) was added thereto to adjust its viscosity to 2,500 poise. The ratio of ODA:p-PDA was 3:1. To 50 g of the resulting polyamic acid solution was added 5 g of isoquinoline. After stirring, the resulting mixture was uniformly applied onto a copper foil at a thickness of 270 μm and then dried by means of heating at a temperature of 80° C., 100° C., 150° C., 200° C., 250° C., 300° C., 350° C., 400° C. and then at 450° C., for 5 minutes each. The properties of the thus obtained board were as shown in Table 1.

EXAMPLE 2

Into 815 g of N,N-dimethylformamide was dissolved 63.70 g of ODA. To this was added 104.09 g of PMDA. After the stirring of 1 hour, ca. 17.20 g of p-PDA was added thereto to adjust its viscosity to 2,500 poise. The ratio of ODA:p-PDA was 2:1. To 50 g of the resulting polyamic acid solution was added 5 g of β-picoline. After stirring, the resulting mixture was uniformly applied onto a copper foil at a thickness of 270 μm and then dried by means of heating at a temperature of 80° C., 100° C., 150° C., 200° C., 250° C., 300° C., 400° C. and then at 450° C., for 5 minutes each. The properties of the thus obtained board were as shown in Table 1.

COMPARATIVE EXAMPLE 1

Into 815 g of N,N-dimethylformamide was dissolved 70.28 g of ODA. To this was added 102.07 g of PMDA. After the stirring of 1 hour, ca. 12.65 g of p-PDA was added thereto to adjust its viscosity to 2,500 poise. The ratio of ODA:p-PDA was 3:1. The resulting resin solution was applied uniformly onto a copper foil at a thickness of 270 μm and then dried by means of heating at a temperature of 80° C., 100° C., 150° C., 200° C., 250° C., 300° C., 350° C., 400° C. and then at 450° C., for 5 minutes each. The properties of the thus obtained board were as shown in Table 1.

TABLE 1

| | Peeling Strength (kgf/cm) | Radius of Curling Curvature (mm) | Linear Expansion Coefficient ($\times 10^{-5} K^{-1}$) | Folding Resistance (times) | Dimensional Stability (%) |
|---|---|---|---|---|---|
| Example 1 | 1.7 | 60 | 2.26 | 280 | 0.08 |
| Example 2 | 1.7 | 66 | 2.05 | 265 | 0.07 |
| Comparative Example 1 | 1.7 | 30 | 3.00 | 273 | 0.07 |

Flexible printed circuit boards according to the present invention exhibit less curling and have sufficiently high adhesiveness and folding resistance. At the same time, they are excellent in heat shrinkage, and their production processes can be simplified, and therefore, they are highly useful as an industrial material.

What is claimed is:

1. In a process for producing a flexible printed circuit board comprising an electrolytic copper foil and a polyimide, the improvement which comprises coating the electrolytic copper foil with a resin solution prepared by adding a tertiary amino compound to a solution of a polyamic acid which is a polyimide precursor represented by the following general formula (I) wherein m and n are integers and the ratio of m to n is 1 to 5:

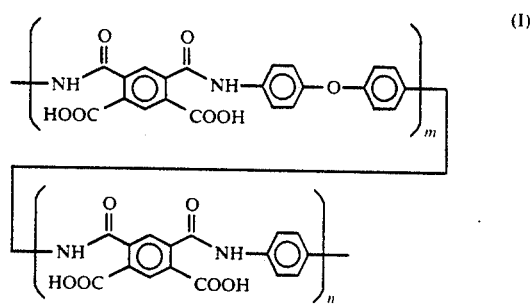

followed by the imidization thereof due to the presence of the tertiary amino compound as the sole imidization agent, the amount of said tertiary amino compound added to the solution being 10 to 50 parts by weight per 100 parts by weight of solid polyamic acid contained in said resin solution.

2. A process according to claim 1, wherein the tertiary amine is a heterocyclic tertiary amine.

* * * * *